United States Patent [19]
Seyyedy

[11] Patent Number: 5,682,344
[45] Date of Patent: Oct. 28, 1997

[54] DESTRUCTIVE READ PROTECTION USING ADDRESS BLOCKING TECHNIQUE

[75] Inventor: Mirmajid Seyyedy, Boise, Id.

[73] Assignee: Micron Technology, Inc., Boise, Id.

[21] Appl. No.: 520,258

[22] Filed: Sep. 11, 1995

[51] Int. Cl.$^6$ ............................................. G11C 11/22
[52] U.S. Cl. .................. 365/145; 365/230.06; 365/233.5
[58] Field of Search ................................. 365/145, 149, 365/210, 233.5, 230.06, 189.01, 230.08

[56] References Cited

U.S. PATENT DOCUMENTS

| | | | |
|---|---|---|---|
| 4,809,225 | 2/1989 | Dimmler et al. | 365/145 |
| 4,873,664 | 10/1989 | Easton, Jr. | 365/145 |
| 4,888,733 | 12/1989 | Mobley | 365/145 |
| 5,010,518 | 4/1991 | Toda | 365/145 |
| 5,086,412 | 2/1992 | Jaffe et al. | 365/145 |
| 5,218,566 | 6/1993 | Papaliolios | 365/145 |
| 5,270,967 | 12/1993 | Moazzami et al. | 365/145 |
| 5,305,273 | 4/1994 | Jinbo | 365/210 |
| 5,309,391 | 5/1994 | Papaliolios | 365/145 |
| 5,424,975 | 6/1995 | Lowrey et al. | 365/145 |
| 5,532,953 | 7/1996 | Ruesch et al. | 365/145 |

FOREIGN PATENT DOCUMENTS

| | | |
|---|---|---|
| 364813 | 10/1989 | European Pat. Off. |
| 3-5996 | 1/1991 | Japan |

OTHER PUBLICATIONS

Wayne Kinney et al., "Memory Applications of Integrated Ferroelectric Technology," *Digest of Technical Papers*, 266–267 (1994).

Reza Moazzami et al., "A Ferroelectric Dram Cell for High Density Nvrams," *1990 Symposium on VLSI Technology*, 15–17 (1990).

Tatsumi Sumi et al., "A 256kb Nonvolatile Ferroelectric Memory at 3V and 100ns," *Digest of Technical Papers*, 268–269 (1994).

*Primary Examiner*—Joseph A. Popek
*Attorney, Agent, or Firm*—Schwegman, Lundberg, Woessner & Kluth, P.A.

[57] ABSTRACT

A ferroelectric random access memory (RAM) is described which uses ferroelectric memory cells to store data. The ferroelectric memory is a static memory in which data stored in the ferroelectric memory cells can be destroyed during read operations. The memory includes circuitry which latches a current memory address during an access operation and prohibits the memory from moving to a new memory address until the destroyed data has been replaced. The memory also includes circuitry which can detect a transition in address data provided on address inputs.

8 Claims, 11 Drawing Sheets

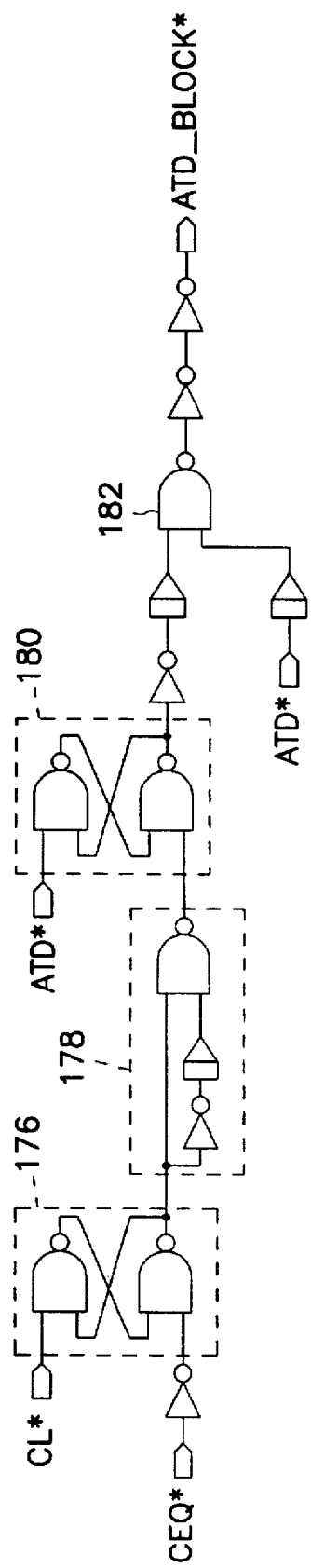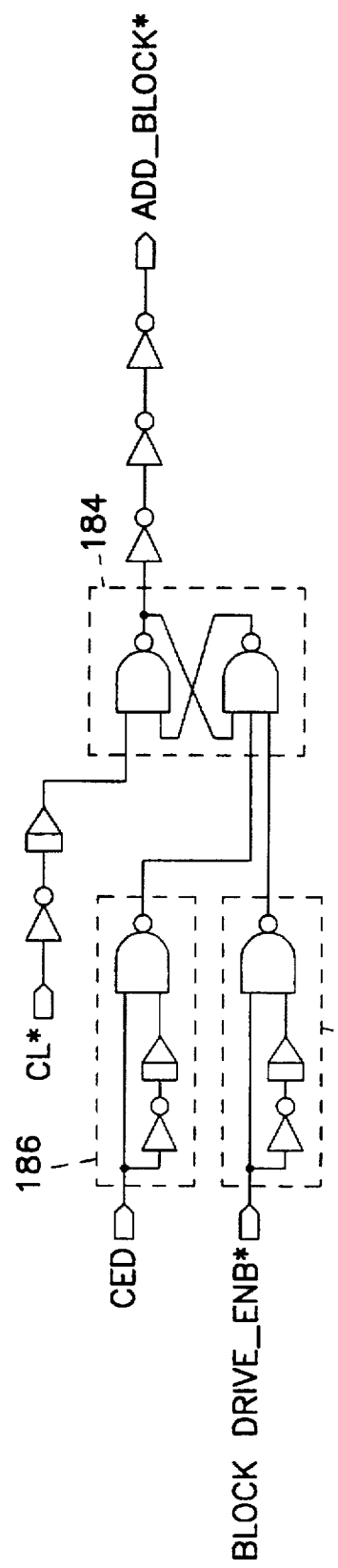
FIG. 9
FIG. 10

DESTRUCTIVE READ PROTECTION USING ADDRESS BLOCKING TECHNIQUE

This invention was made with government support under Contract No. MDA972-94-C-0006 awarded by Advanced Research Projects Agency (ARPA). The Government has certain rights in this invention.

TECHNICAL FIELD OF THE INVENTION

The present invention relates generally to static ferroelectric memories and in particular the present invention relates to protecting data stored in a ferroelectric memory cell during an access operation.

BACKGROUND OF THE INVENTION

Placing ferroelectric material between the plates of a capacitor on a semiconductor substrate causes the capacitor to exhibit a memory effect in the form of charge polarization between the plates of the capacitor. In effect, when the capacitor is charged with the field lines running in one direction across the capacitor plates, a residual charge polarization remains after the charge is removed from the capacitor plates. If an opposite charge is placed on the capacitor plates, an opposite residual polarization remains. A plot of the applied field voltage (E) across the plates of the capacitor against the polarization (P) of the ferroelectric material between the plates of the capacitor exhibits a classic hysteresis curve as shown in FIG. 1. This type of hysteresis response of ferroelectric material between the plates of the capacitor manufactured on a semiconductor die as known in the art and is described in U.S. Pat. No. 4,873,664 to Eaton Jr., which is incorporated herein by reference.

Using ferroelectric material in the manufacture of capacitors for use in the cells of memory arrays is also known in the art. By applying a coercive voltage across the plates of the ferroelectric capacitor to produce one polarization or another, the residual polarization stores a nonvolatile 1 or 0 in the cell. If a ferroelectric capacitor has zero volts applied across its plates, it may be polarized as indicated by either point A or point D in FIG. 1. Assuming that the polarization is at point A, if a positive voltage is applied across the capacitor which is greater than the "coercive voltage" indicated by line B, then the capacitor will conduct current and move to a new polarization at point C. When the voltage across the capacitor returns to zero, the polarization will remain the same and move to point D. If a positive voltage is applied across the capacitor when it is polarized at point D, the capacitor will not conduct current, but will move to point C. It can be seen that a negative potential can be used to change the polarization of a capacitor from point D to point A. Therefore, points A and D can represent two logic states occurring when zero volts are applied to the capacitor and which depend upon the history of voltage applied to the capacitor.

The reading of the polarization of the ferroelectric capacitor can be a destructive read in which a pulse is applied to the ferroelectric capacitor and the amount of resultant charge is either low if the pulse polarity agreed with the previous memorization polarity, or the resultant charge is higher if the charge polarity placed on the capacitor is of the opposite polarity last placed across the plates of the capacitor. This minute difference between an agreeable charge and an opposite charge can be measured to determine what the previous polarization on the ferroelectric capacitor was as it was last written. If a large charge results from reading a memory cell, the memory cell polarization will move from one state to the other state, for example point A to Point D. Thus, the data read from the memory cell must be restored.

The fact that the ferroelectric capacitors require a destructive read to determine the last polarization, and the fact that the resultant charge differences of the ferroelectric capacitor between an agreeable applied pulse and an opposite applied pulse make the technique of reading and writing ferroelectric memories a difficult task. The benefit of having a nonvolatile memory in which stored data remains without any battery backup or other external application of power is of great use in the computer and control industries. However, for any such nonvolatile memories to be of any use, the memories must be of a high enough density and must have a fast enough response time to make them commercially more attractive than battery backed up DRAM, mechanical disk storage and other types of nonvolatile storage.

One of the shortcomings of the prior art is the fact that the ferroelectric capacitors age through use, producing distinctly nonlinear hysteresis curves such as that shown in FIG. 2. Thus, it becomes increasingly difficult to determine the correct polarization of the cells as they age. For example, if a memory cell fabricated as a ferroelectric capacitor is polarized at point A in FIG. 2, a positive voltage greater than the coercive voltage B will move the polarization of the cell to point C. When moving from point A to point C the capacitor will conduct current. When reading a memory cell having polarity of point D using a positive voltage, however, a current is also conducted as the polarity moves to point C. The differences between the resultant currents of the two different states of the capacitor, therefore, becomes smaller as the capacitor ages. It will be appreciated that reading a memory cell having a hysteresis curve of FIG. 2 will be more difficult than reading a memory cell having an ideal hysteresis curve of FIG. 1.

Another shortcoming of the prior art is the inability to produce high density ferroelectric memories having high operating speeds comparable to that of DRAM storage devices. Along these lines, the aforementioned Eaton Jr. patent describes the application of ferroelectric capacitors to high density memory storage, as shown in FIG. 3. In this arrangement, each memory storage cell comprises a pair of ferroelectric capacitors and a pair of access transistor. One plate of the pair of ferroelectric capacitors is connected to a plate line, while the other plates of the ferroelectric capacitor are connected through access transistors to separate bit lines. In operation, a momentary voltage pulse is placed on the ferroelectric capacitors between the bit lines and the plate line to polarize the ferroelectric material of the two ferroelectric capacitors, resulting in a polarization of one direction for one capacitor and an opposite polarization for the second ferroelectric capacitor.

Eaton Jr. takes this concept a step further by using a regular array of ferroelectric capacitors, whereby each cell contains two ferroelectric capacitors and two access transistors. The ferroelectric capacitors within each memory cell receives complementary input signals such that the ferroelectric capacitors are polarized in opposite states to indicate a 1 or a 0. When the pairs of capacitors for each cell are read, a resulting voltage on the bit lines, which result from applying a pulse on a plate line, is compared using a differential sense amplifier to compare the voltages on the bit lines and thus determine the polarity on the ferroelectric capacitors within the cell.

The disadvantage of the above approach is that Eaton Jr. requires that each cell contain at least two transistors and two ferroelectric capacitors. This approach takes up a large area of the chip for implementation, which limits the overall density of a memory array.

An improvement on the Eaton Jr. et al. approach is found in U.S. patent application Ser. No. 08/175,923 entitled "REFERENCE CIRCUIT FOR A NONVOLATILE FERROELECTRIC MEMORY" to Lowry et al. This patent application is assigned to the same assignee as the present patent application. It is not prior art. This improvement for ferroelectric memory designs from Lowry et al. describes an array of memory cells in which each cell comprises a single ferroelectric capacitor and a single access transistor. The cells are arranged in a regular array such that common word lines and common plate lines are used to access rows of ferroelectric capacitor cells. The Lowry et al. patent application describes a folded bit line architecture in which bit lines for adjacent columns have staggered cells, such that a word line (WL) from one row does not activate memory cells 80 on adjacent bit lines, as seen in FIG. 4. It will be appreciated that the plate lines PL0 and PL1 can be combined as one common plate. In the Lowry et al. patent application, the result is an active bit line (BL) for one column, and an inactive bit line for an adjacent column when the word line and plate lines are activated for reading or writing a particular ferroelectric memory cell. With an adjacent inactive bit line, the unused bit line is available for attachment to a single-ended reference circuit 90 using a reference decoder 92. The single-ended reference circuit of Lowry et al. allows for placing a highly accurate voltage on the adjacent unused bit line, which can be used by the sense amplifier 94 to compare to any active bit line to determine the state of the ferroelectric capacitor, when the plate line is pulsed. U.S. patent application Ser. No. 08/175,923 to Lowry et al. is hereby incorporated by reference.

Integrated memory circuits which use ferroelectric memory cells are susceptible to loses of data during read and write operations. When reading a ferroelectric memory cell located at a memory address, the data stored on the cell can be lost and must be replaced before accessing a new memory address. Additionally, during a write operation where the data stored on the memory cell is to be replaced with the opposite logic state, several steps must be completed to store the new data. During these write operation steps, the memory address must not change, or the new data will be lost. Still lacking in the industry is a ferroelectric memory array using a RAM architecture which insures that data will not be lost during an asynchronous memory cell access operation.

SUMMARY OF THE INVENTION

The above mentioned problems with reading from and writing to ferroelectric memories and other problems are addressed by the present invention and which will be understood by reading and studying the following specification. An integrated circuit memory is described which has ferroelectric memory cells and circuitry to insure that a new memory cell address is not accessed until data is properly stored in a currently accessed memory cell.

In particular, the present invention describes an integrated memory circuit comprising a memory array having a plurality of ferroelectric memory cells arranged in rows and columns, address inputs to receive an address of a first row of the memory array, and access circuitry to access a row of the memory array. The memory also includes an address protection circuit which comprises an address blocking circuit to latch the address of the first row of the memory array and prevent a second row of the memory array from being accessed.

The address protection circuit can further comprise a detection circuit to detect a transition of the address inputs, and an address detection blocking circuit to disable the detection circuit. Further, the address blocking circuit can comprise a flip-flop coupled to the address inputs, and a latch circuit electrically located between the flip-flop and the address inputs to latch the flip-flop.

In another embodiment, the detection circuit comprises a plurality of comparator circuits connected to each one of the address inputs for comparing a present state of the address inputs to a prior state of the address inputs, and a generator circuit connected to the plurality of comparator circuits to produce a signal used to enable the address detection blocking circuit. In yet another embodiment, the address detection blocking circuit comprises a flip-flop coupled between the address inputs and the detection circuit, and a latch circuit electrically located between the flip-flop and the address inputs to latch the flip-flop.

Another embodiment provides an integrated static memory circuit which comprises a memory array having ferroelectric memory cells arranged in rows and columns, a controller, address inputs for receiving row addresses, and access circuitry coupled to the address inputs for accessing a row in response to a received row address. The memory also includes a address protection circuitry connected to the controller. The address protection circuitry comprises a detection circuit coupled to the address inputs for detecting a transition in the received row addresses, address detection blocking circuit connected to the detection circuit for selectively disabling the detection circuit, and an address blocking circuit connected to the controller to selectively latch the address of a first row of the memory array and prevent a second row of the memory array from being accessed.

The invention includes a method of reading a ferroelectric memory. The method comprises the steps of accessing ferroelectric memory cells located at a first memory address, prohibiting the access of ferroelectric memory cells located at a second memory address, reading data stored the ferroelectric memory cells located at the first memory address, restoring the data read from the ferroelectric memory cells, and enabling the access of ferroelectric memory cells located at a second memory address.

In still another embodiment, a method is described for protecting data stored in a ferroelectric memory having ferroelectric memory cells arranged in rows and columns, address input lines for receiving row addresses, and detection circuit coupled to the address input lines for detecting a transition in the received row addresses. The method comprises the steps of receiving a first address of a first row on the address input lines, disabling the detection circuit, and reading data stored on ferroelectric memory cells located on the first row. The method can further include the steps of enabling an address blocking circuit to latch the first address of the first row, restoring the data read from the ferroelectric memory cells located on the first row, and disabling the address blocking circuit. Finally, the method can include the steps of enabling the detection circuit, detecting a receipt of a second address of a second row on the address input lines using the detection circuit, and restoring the data read from the ferroelectric memory cells located on the first row in response to the detection circuit.

BRIEF DESCRIPTION OF THE DRAWINGS

FIG. 9 is a schematic diagram of an address transition blocking circuit of FIG. 6;

FIG. 10 is a schematic diagram of an address blocking circuit of FIG. 6;

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

This invention concerns electrical circuitry which uses voltages to represent the two binary logic levels. The words "low" and "high" in this specification refer generally to the false and true binary logic levels, respectively. Signals are generally considered active when they are high, however, an asterisk (*) following the signal name, or a bar above the signal name in this application indicates that the signal is negative or inverse logic. Negative or inverse logic is considered active when the signal is low.

Figure 1:
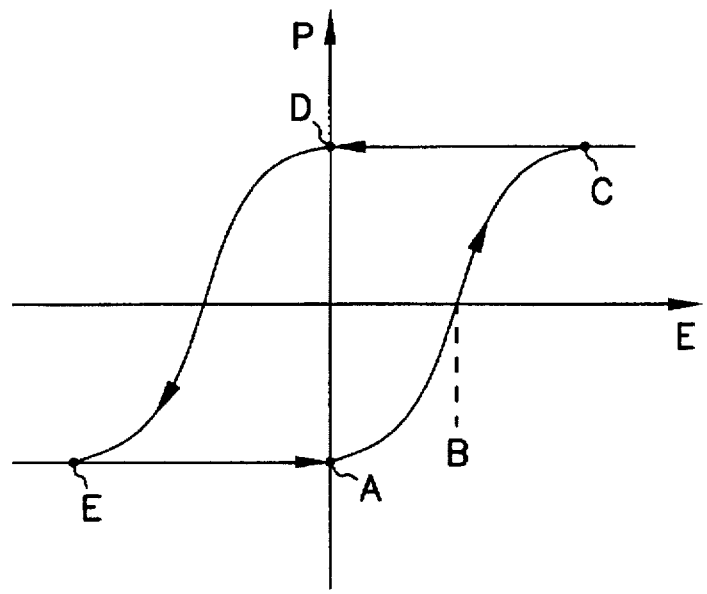
FIG. 1 is a hysteresis curve of a ferroelectric capacitor.
Figure 2:
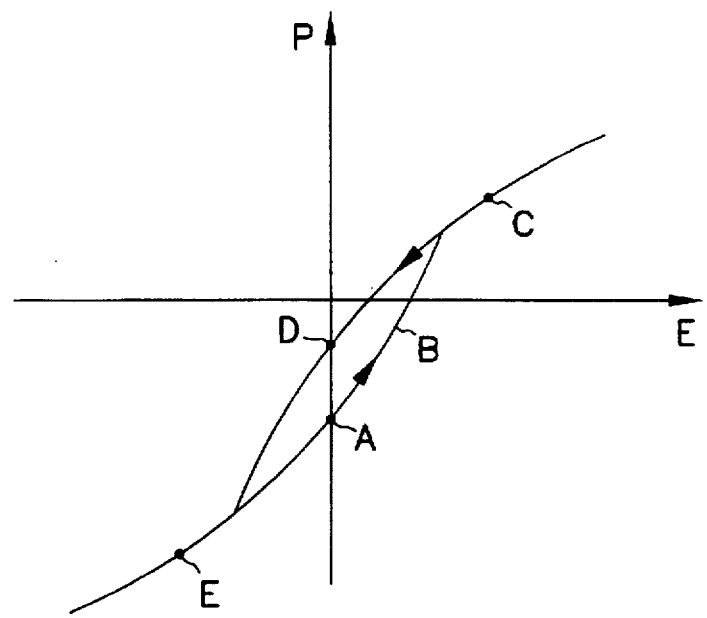
FIG. 2 is a hysteresis curve of an aged ferroelectric capacitor.
Figure 3:
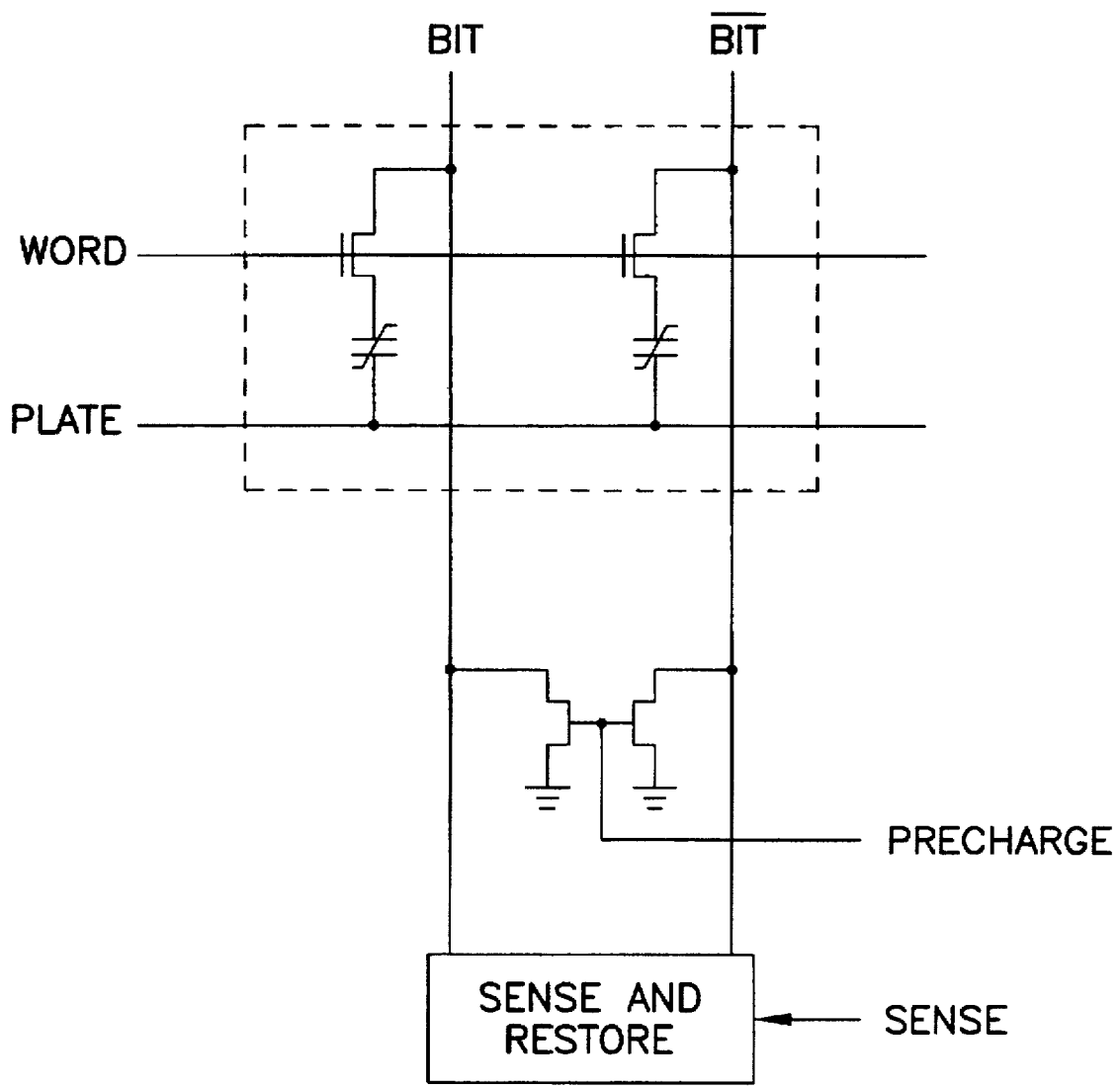
FIG. 3 is a ferroelectric memory having two capacitors per memory cell.
Figure 4:
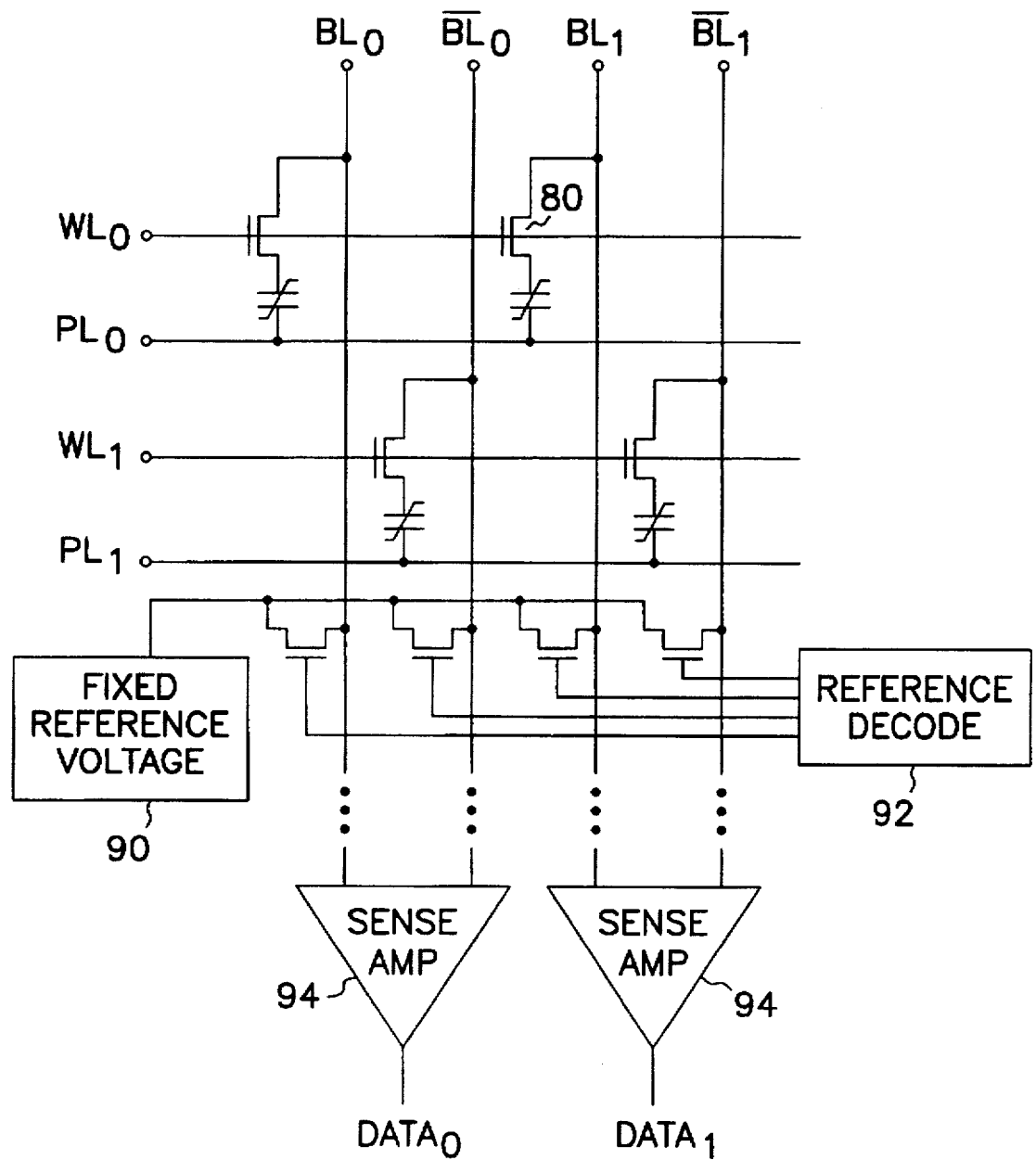
FIG. 4 is a portion of a ferroelectric memory array having a folded bit line architecture and single-ended reference circuit.
Figure 5:
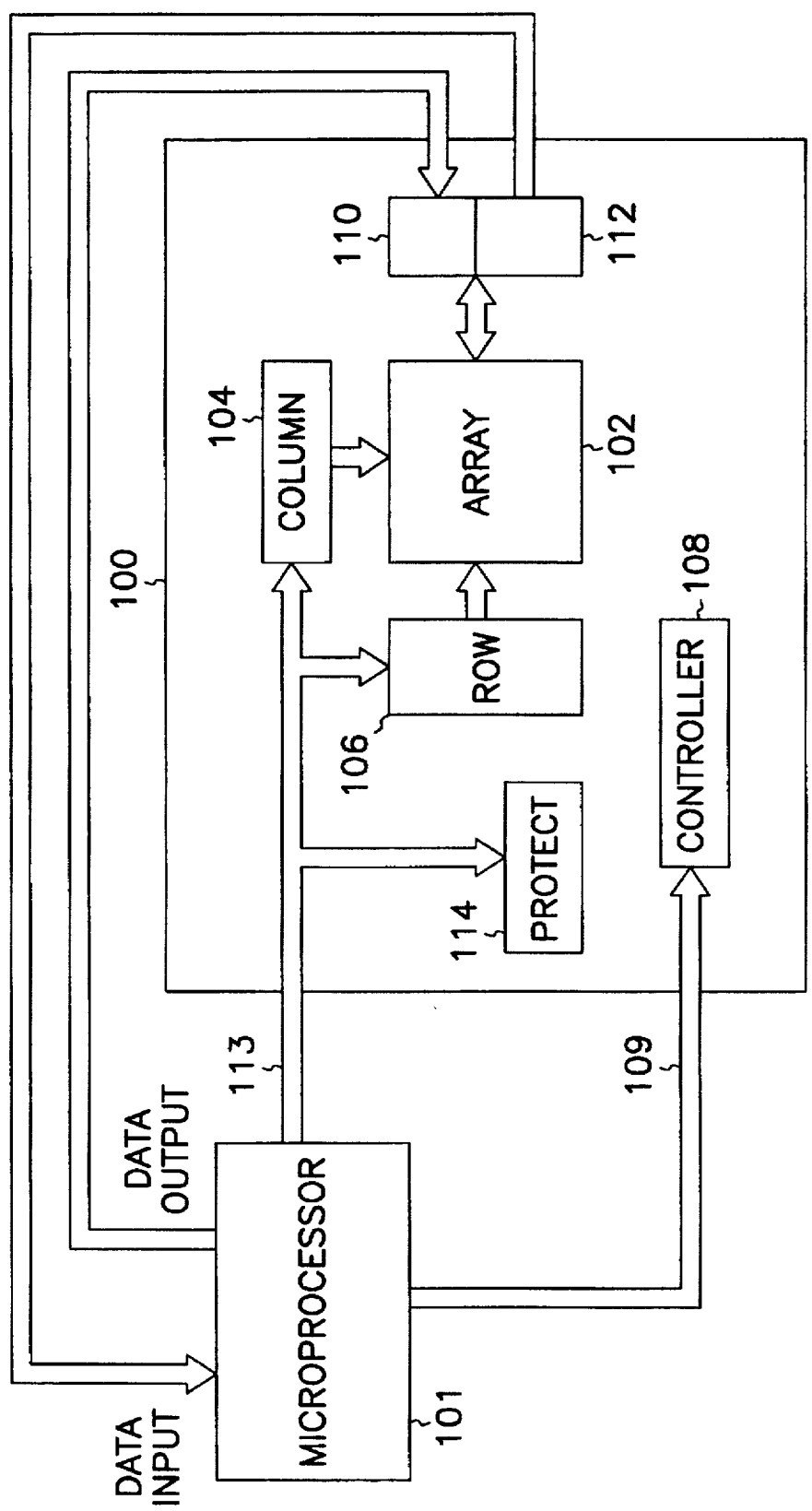
FIG. 5 is a block diagram of a memory incorporating the present invention.

FIG. 5 shows a general block diagram of a memory circuit 100 incorporating the present invention. The memory circuit is coupled to a microprocessor 101 and includes a memory array 102, column 104 and row 106 decoders, and a control circuit 108. The memory circuit also includes input 110 and output 112 buffers connected to data input and data output lines, respectively. The data input and output lines can be multiplexed together, but have been illustrated separately for simplicity. Address lines 113 are provided as input to the row and column decoders to address a portion of the memory array. Address protection circuitry 114 is provided to insure that an address transition during a read or write operation does not interfere with the data stored in a memory cell. The address protection circuitry is particularly important in a ferroelectric memory. Reading data stored in a ferroelectric memory cell can be destructive, such that the data must be re-written to the memory cell. If the address changes prior to the data being rewritten the memory cell will not be updated and the memory will be lost. Further, multiple steps are required when writing to a ferroelectric memory cell and an address change during these steps must be avoided to protect the data being stored.

In operation, the memory circuit control 108 responds to control inputs 109 from the microprocessor to perform different operations on the memory array. In particular, the control circuit is used to read data from and write data to the memory array 102. During one of these access operations, an address provided on the address lines 113 is decoded by the row decoder 106 to access one row of the memory array. Likewise, input provided on the address lines is decoded by the column decoder 104 to access at least one column of the memory array. During a read operation, the data stored in the addressed memory cell(s) is then transferred to the output buffer 112 and provided on the data output lines. In a write operation, the addressed memory cell is accessed and data provided on the data input lines is stored in the cell.

Figure 6:
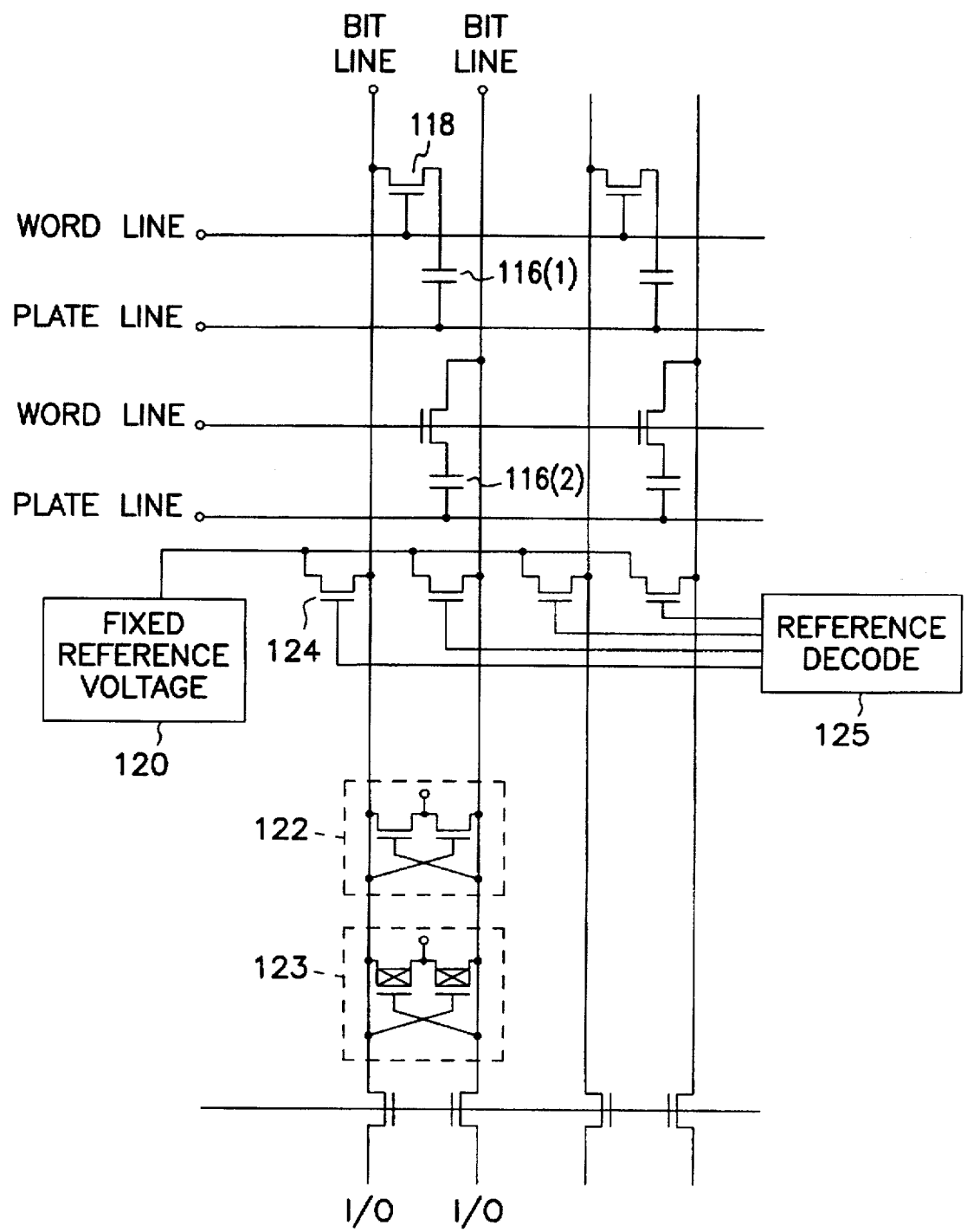
FIG. 6 is a portion of a ferroelectric memory array having a folded bit line architecture and single-ended reference circuit of FIG. 5.

FIG. 6 illustrates a portion of the memory array in more detail. The memory array is arranged in a folded bit scheme, as known to one skilled in the art. Two communication lines, Bit line 1 and Bit line 2, couple ferroelectric memory cell capacitors 116 to the data I/O lines which are connected to the input and output buffers 110 and 112, see FIG. 5. The memory cells have one plate connected to a plate line and the other plate connected to an n-channel MOS access transistor 118. The gate of the access transistor is connected to a word line. The word lines and access transistors are arranged so that one word line couples a memory cell 116(1) to Bit line 1, and the next word line couples a memory cell 116(2) to the Bit line 2.

To access a memory cell, the external address lines 113 are decoded to identify which row of the memory array is to be accessed. The corresponding word line is then raised to a high voltage level so that all of the access transistor having their gate connected to that word line are activated. All of the memory cells associated with that wordline, therefore, are coupled to one of the bit lines. If the memory cell were a standard DRAM capacitor, the charge stored on the memory cell capacitors would be shared with the bit lines when the access transistor 118 is activated. Likewise, a ferroelectric memory cell having some non-remnant charge stored thereon will produce a small change to the bit line voltage. If the non-remnant component of the ferroelectric memory cell has been discharged, the bit line voltage will not change. To access the data stored in the memory cell, the plate line associated with the addressed row is pulsed high. As known to one skilled in the art, if the polarization of the ferroelectric dielectric is in one state and the plate line is pulsed high, the current through the memory cell 116 will increase the voltage on the bit line which is coupled thereto. If the polarization of the memory cell is in the opposite state, current through the memory cell is resisted and the voltage of the coupled bit line does not change.

The change in the voltage on the bit line can be sensed using a sense amplifier circuit and a reference circuit 120 which produces a reference voltage. The sense amplifiers are typically comprised of both an n-sense 122 and a p-sense 123 amplifier and detect the difference in the voltage on the bit line and the reference circuit voltage coupled to the other bit line via coupling transistor 124, as known to one skilled in the art. The sense amplifiers drive the bit line pairs to the appropriate power rail. That is, if the voltage of the bit line is higher than the reference circuit voltage, the bit line is driven to the positive power rail. Conversely, if the bit line is lower than the reference circuit, the bit line is driven to ground. It will be recognized that different sense amplifier and reference circuits can be used without departing from the spirit of the present invention. A reference decode circuit 125 is provided to selectively connect the reference voltage to the unused bit line. By reading the memory cell, the state of the polarization may be reversed and thus the data which was stored on the cell will be revered. That is, in the preferred embodiment the polarization of the dielectric is such that a logical "one" provides a change in voltage of the digit line. To provide the requisite voltage change on the bit line, the polarization of the dielectric is changed. To read a logical one, therefore, the polarization of the memory cell is changed by reading the cell and will represent a logical "zero" after the cell has been read. If, on the other hand, the memory cell was storing a zero, there will be no voltage change on the bit line and the memory cell will remain polarized in a zero state. It can be seen that by merely reading a memory cell the data will be lost if the memory cell was storing a one. A write-back operation must be performed on the memory cell so that the polarization of the memory cell is returned to its pre-read state.

To write a one to the memory cell 116, the bit line coupled to the memory cell must be raised to the positive power rail while the plate line is at a low potential. This reverses the polarization of the ferroelectric dielectric from that resulting from pulsing the plate line high. The sense amplifiers 122 and 123 are used to write-back a logical one to a memory cell from which a one was read. All of the sense amplifiers associated with a row of memory cells in the memory array are strobed at once. If the column address, therefore, is changed during the read operation, the data stored in any one of the memory cells of a row will not be lost. If, however, the row address is changed during the read operation prior to the sense amplifiers driving the active bit line to a full positive power rail, the access transistor 118 connected to the addressed memory cell will be turned off and the data cannot be re-written to the memory cell.

Figure 13:
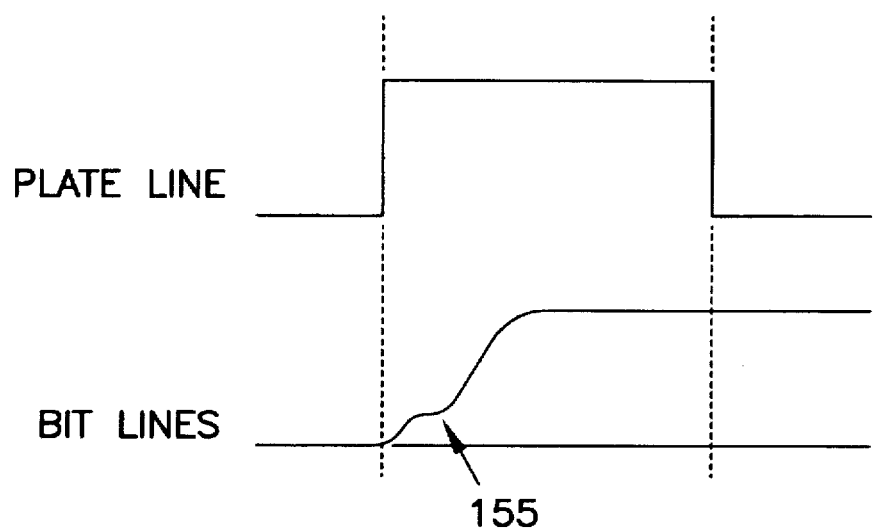
FIG. 13 is a diagram of a clocked plate line access operation.
Figure 14:
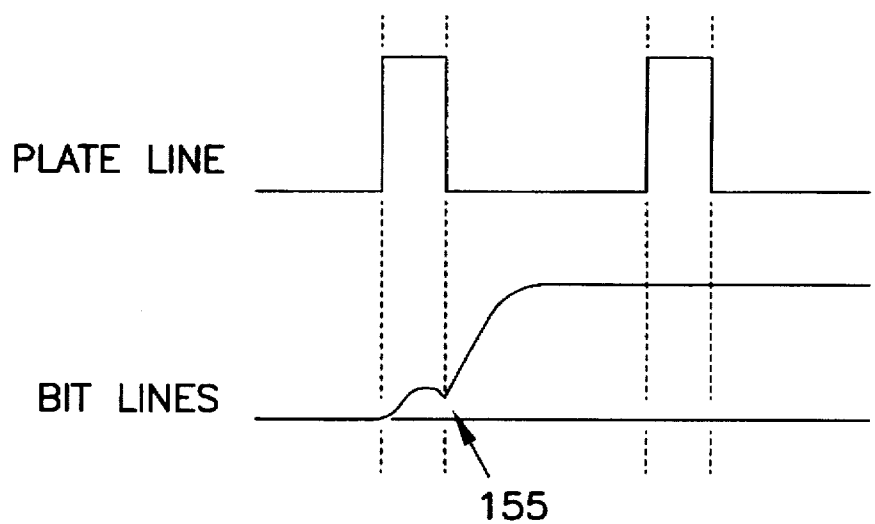
FIG. 14 is a diagram of a pulsed plate line access operation.

It will be helpful to fully understand the effect of the voltage placed on the memory cell capacitor plates. FIGS. 13 and 14 illustrate two alternate ways of reading a ferroelectric memory and restoring the data read therefrom. The first method is referred to herein as a clocked plate line as illustrated in FIG. 13. To access a memory cell, a wordline is selectively raised. The plate line of the memory cell is then raised and the data stored on the cell is coupled to the bit line as described above. If the memory cell was storing a 1, the cell was rewritten to a 0. The sense amplifier are then fired at reference number 155 so that the bit lines are driven to full power rails. Because the plate line is high when the bit lines are driven to rail, a 1 is not restored on the memory cell. A 1 will be restored when the plate line goes low while the bit line is high. It will be understood that the bit line potentials can be reversed to change the data on the memory cell and that a 0 will be written to the cell when the bit line is low while the plate line is high.

The second method of reading and restoring a memory cell is referred to as a pulsed plate line and illustrated in FIG. 14. To read the cell, the plate line is pulsed high twice while the cell is coupled to a bit line. The data stored on the memory cell will be reflected on the bit line after the first high pulse and the bit line pair is then driven to power rails at reference number 155. If the bit line coupled to the memory cell goes high while the plate line is low, the memory cell will be written to a 1. If the potential on bit lines are reversed to change the data on the memory cell, a 0 cannot be written to the cell until the plate line is pulsed high again. The plate line is therefore pulsed high a second time to insure that the memory cell stores the proper data.

Because the polarization of the ferroelectric memory cell is determined by the potential of both of the cell's plates at any given time. That is, a 1 is stored anytime the bit line is high while the plate line is low, and a 0 is written anytime the plate line is high while the bit line is low. If both plates are at the same potential, the data stored on the cell is not changed. It can be appreciated that the clocked plate line method is an efficient way of reading from and writing new data to a memory cell, and that the pulsed plate line method is an efficient way of reading and restoring data from a memory cell. Both methods are interchangeable, but the pulsed method is used herein to detail the present invention.

Figure 7:
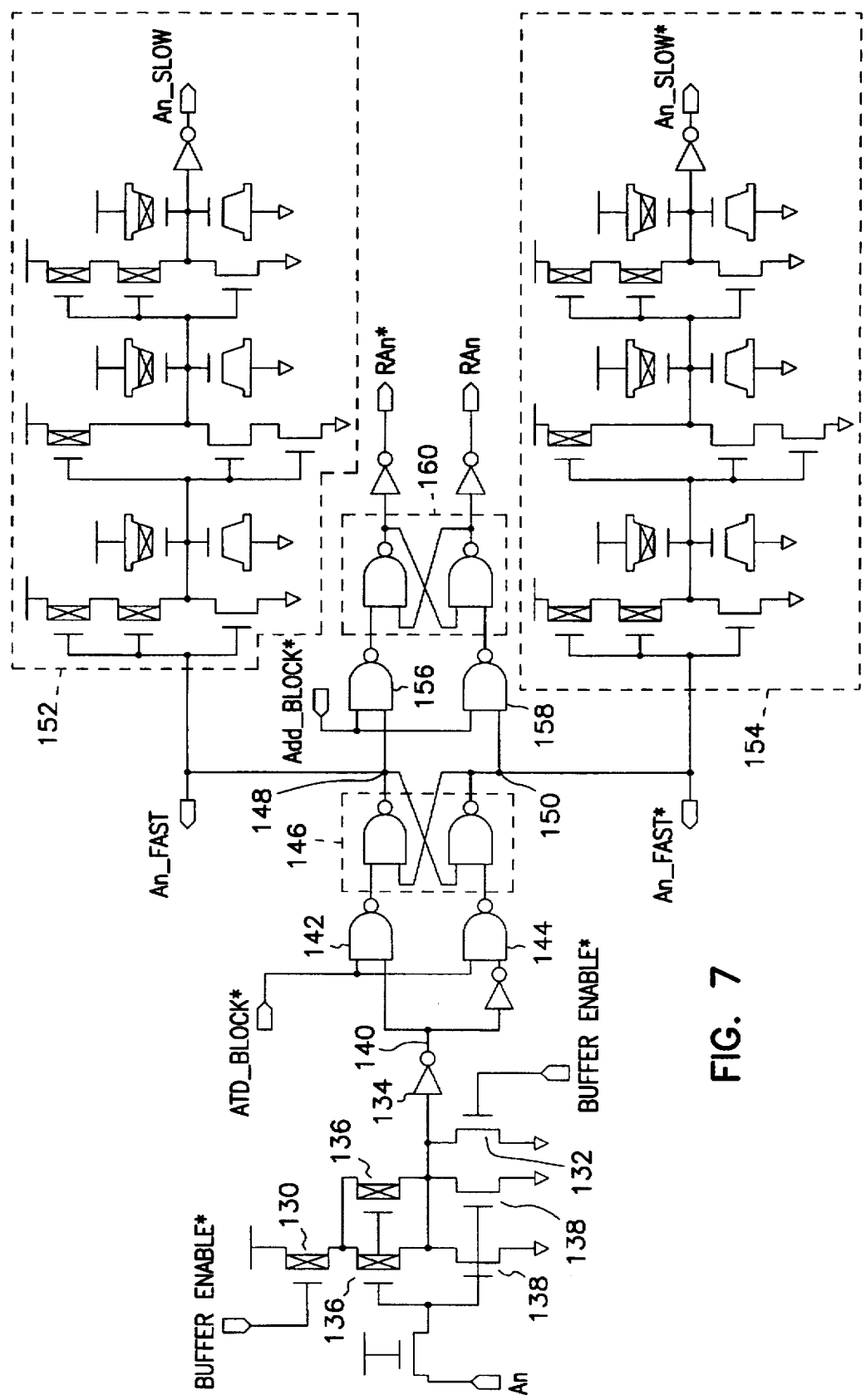
FIG. 7 is a schematic diagram of an address buffer circuit of FIG. 5.

FIGS. 7–11 illustrate circuits which are included in the address protection circuit 114 to insure that an address change does not interrupt the storage of data to a memory cell. FIG. 7 shows an address buffer circuit which receives an address line input (An) from one of the address inputs. The circuitry shown in FIG. 7, therefore, is provided for each one of the address input lines. Buffer$_{13}$ Enable* signal is used to selectively activate transistors 130 and 132. If the Buffer_Enable* signal is low, transistor 130 is activated such that a low voltage level on An will pull the input to inverter 134 high through transistors 136. A high level on An will, therefore, pull the input to inverter 134 low through transistors 138. Inverter 134 translates its input so that its output 140 reflects the same state as the An input at node 140.

Node 140 is input to NAND gate 142 and the inverse of node 140 is input to NAND gate 144. Address transition detector block signal, ATD_Block*, is provided as an input to NAND gates 142 and 144 to provide an enable function. That is, when ATD_Block* is low the output of NAND gates 142 and 144 are latched at a high voltage level. With ATD_Block* high, the output of NAND gates 142 and 144 invert their second input and drive flip-flop 146 so that a representation of the address input, An, is provided on node 148 and its inverse, An*, is provided on node 150. Node 148 and 150 are also denoted as An_fast and An_fast* signals, respectively, for reference in circuits described below. Delay circuit 152 delays the signal transition on node 148 to provide a signal herein referred to as An_slow. Likewise, delay circuit 154 delays the signal transition on node 150 to provide a signal herein referred to as An_slow*.

The signal on node 148 is input to NAND gate 156 and the signal on node 150 is input to NAND gate 158. Address block signal, Add_Block*, is provided as an input to NAND gates 156 and 158 to function as an enable signal. That is, when Add_Block* is low, the output of NAND gates 156 and 158 are latched at a high voltage level and the outputs of flip-flop 160 are also latched at their present state. With Add_Block* high the output of NAND gates 156 and 158 invert their other input and drive flip-flop 160 to provide row address lines, RAn and its inverse, RAn*.

Figure 8:
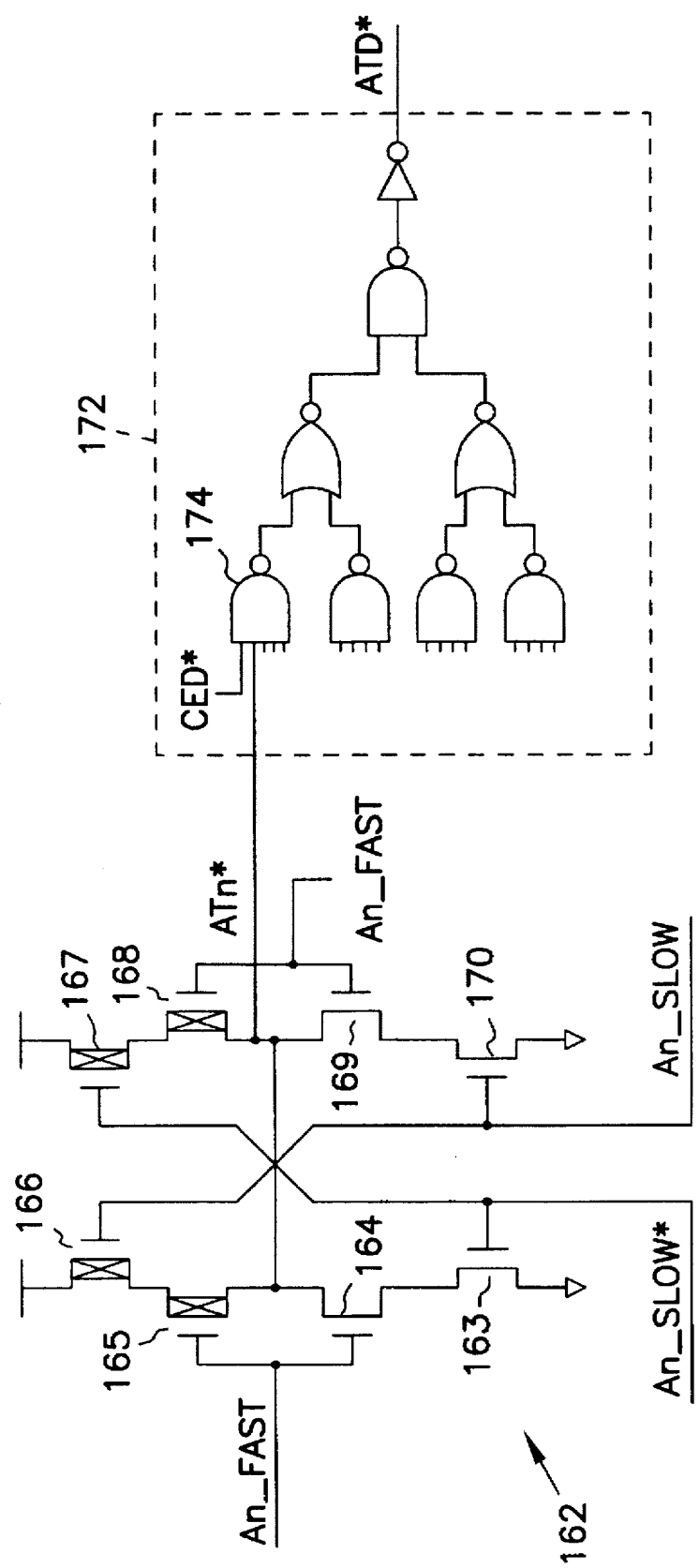
FIG. 8 is a schematic diagram of an address detection circuit of FIG. 6.

FIG. 8 shows a schematic of a portion of an address detection circuit 162 used to detect when a change in one of the address lines has occurred. The signals generated from node 148 and 150 (An_fast, An_fast*, An_slow, and An_slow*) are used to generate a pulse on the address transition output line, ATn*. Address detection circuit 162 acts as a comparator circuit, therefore, by comparing a present state of an address line to a prior (or delayed) state of the address line. Assuming that prior to an address transition the address fast and slow lines have stabilized at a common voltage level, if the An line is at a low voltage, transistor 163 is activated and transistor 164 is turned off. Transistors 167, 168 and 170 are turned off, and transistor 169 is activated. The ATn* signal is pulled high, however, through the activated pair of transistors 165 and 166. If the An_fast signal changes to a high voltage state, transistor 165 is turned off and the ATn* output is pulled low through transistor pair 163 and 164. When the slow address signals change to the state of the fast address signals, transistor 163 is turned off and transistor 167 is activated to pull ATn* high again. The ATn* signal, therefore, pulses low when the An_fast signal goes from a high voltage state to a low state. It will be understood that the ATn* signal is normally high and pulses low when the An line transitions from either a low to a high state or a high to a low state. The pulse width is set by the parameters of the delay element.

The ATn* signal is input into an ATD* generator circuit 172 for producing the ATD* output. The ATD* generator circuit 172 comprises a network of NAND gates and NOR gates, and an inverter. NAND gate 174 includes one input which is the inverse delayed chip enable signal (CED). The chip enable input (CE) is explained in detail below. The ATD* generator circuit 172 is enabled when CED is high. That is, the ATD* output is high when CED is high and is latched low when CED is low. When one of the ATn* lines pulses low to indicate a transition in an address line, the ATD* signal will be pulsed low in response, thereto.

As explained above, the ATD_Block* line is used to block the detection of an address line transition and the Add_Block* line is used to latch the address lines at their current state. It will become apparent from the detailed description below how these signals can be used to protect the data read from a ferroelectric memory cell. The circuitry shown in the schematics of FIGS. 9 and 10 are used to generate the ATD_Block* and Add_Block* signals.

Referring to FIG. 9, a circuit is described for generating the ATD_Block* signal used to disable the address transition circuit described above. Flip-flop 176 receives both the clock, CL*, and a chip equilibration signal, CEQ*. The output of flip-flop 176 will be low when both CL* and CEQ* are low. The CEQ* signal is used to equilibrate the I/O lines via an equilibration circuit (not shown). The output of flip-flop 176 is connected to pulse generator circuit 178. The pulse generator will have a normally high output, but will pulse low when its input transitions from a low state to a high state. Because the output of pulse generator 178 is normally high, the output of flip-flop 180 will be low when ATD* is low. NAND gate 182 will produce a low output when its inputs are high. The ATD_Block* signal, therefore, will go low when the ATD* signal goes high. In operation, signals CEQ*, CL* and ATD* are all initially low. The output of flip-flop 176 is low, and the output of flip-flop 180 is also low. The output of NAND 182 is initially high, therefore, ATD_Block* is initially high. The outputs of flip-flops 176 and 180 will not change states if either the CL* or ATD* signals go high. The output of NAND gate 182 and ATD_Block* signal will go low, however, when ATD* goes high. If the CEQ* signal then goes high, flip-flop 176 will latch its output high and pulse generator 178 will produce a low pulse. In response to the pulse, the output of flip-flop 180 will latch to a high state, provided the ATD* signal is high. The CL* and ADT* inputs to flip-flops 176 and 180, respectively, are used as latch enables to latch the ATD_Block* signal high when CEQ* goes high.

Referring to FIG. 10, a circuit is detailed which can be used to produce the Add_Block* signal. As explained above, the Add_Block* signal is used to latch the address buffer at its current state until the memory cell has been written to its proper polarization following a read or write operation. In general, a flip-flop 184 receives inputs from pulse generator circuits 186 and 188, and the inverse of the CL* signal. The Add_Block* signal will follow the inverse of the output of flip-flop 184. In operation, the outputs of pulse generators 186 and 188 are normally high and will pulse low if their inputs transition from a low state to a high state. When CL* goes high, the output of flip-flop 184 will go high and Add_Block* will go low. If either the CED or the BlockDrive_enable* signal transition from a low state to a high state while CL* is high, the output of flip-flop 184 will go low. CL*, therefore, can be used to activate Add_Block* to a low level and either the CED or the BlockDrive_enable* signal can be used to reset the output of flip-flop 184 to a low state when CL* is low. The BlockDrive_Enable* signal is a used to drive the row decoders, as known to one skilled in the art, for an identified block of the memory cells which is being addressed by the address lines.

Figure 11:
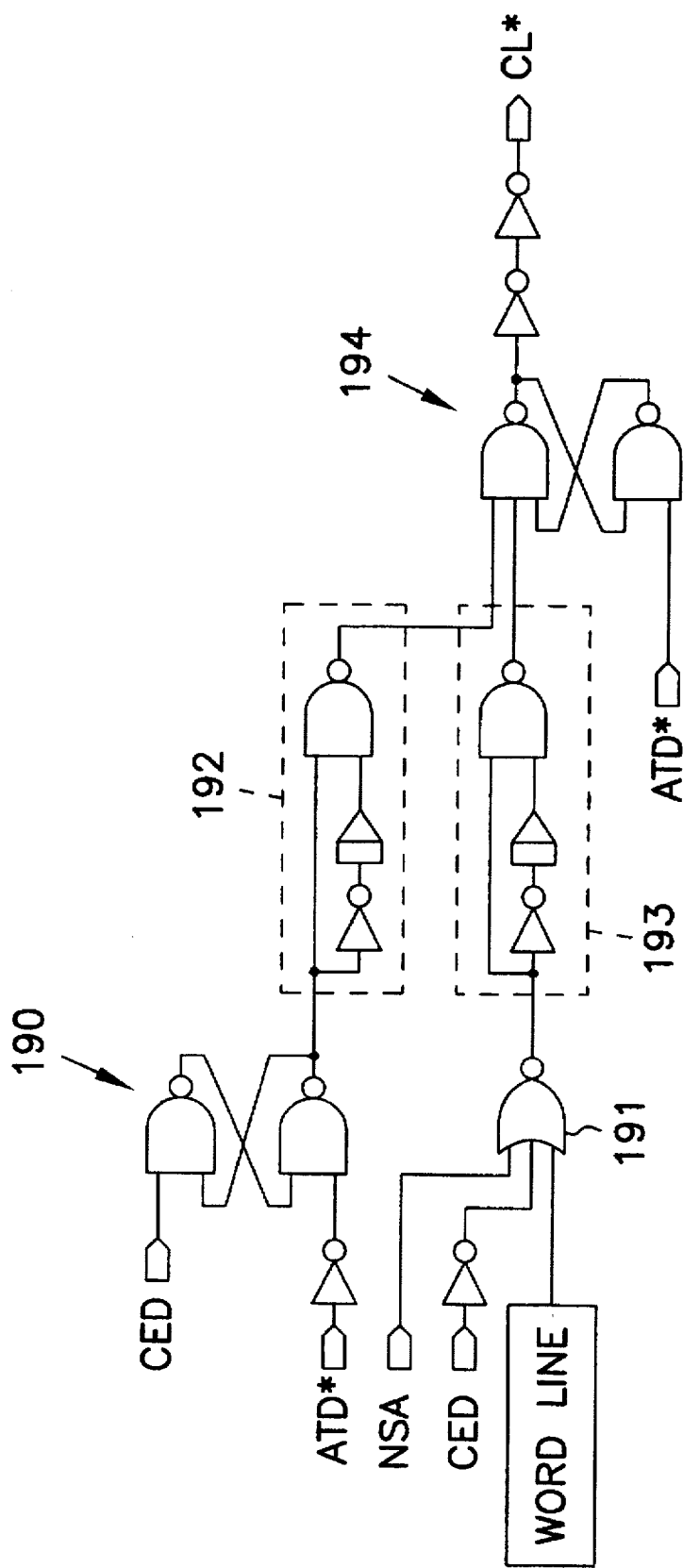
FIG. 11 is a schematic diagram of a clock signal circuit of FIG. 6.

FIG. 11 shows a circuit for generating the CL* signal. Using flip-flops 190 and 194 and pulse generator circuit 192, the CL* signal can be toggled. The output of pulse generator 192 is normally high. When ATD* is low, the output of flip-flop 194 and the CL* signal are low. They will remain low even if ATD* goes high. However, if CED goes high when ATD* is high, pulse generator 192 will toggle the output of flip-flop 194 to a high state such that CL* goes high.

Alternatively, NOR gate 191 and pulse generator circuit 193 can be used to transition CL* from a low to a high state. The output of NOR 191 is low when all of its input signals is low. When one of its inputs goes high, the pulse generator circuit 193 will produce a low pulse. Therefore, if either the n-sense amplifiers are strobed, a word line is raised or the CED signal goes low, a low pulse is provided.

Figure 12:
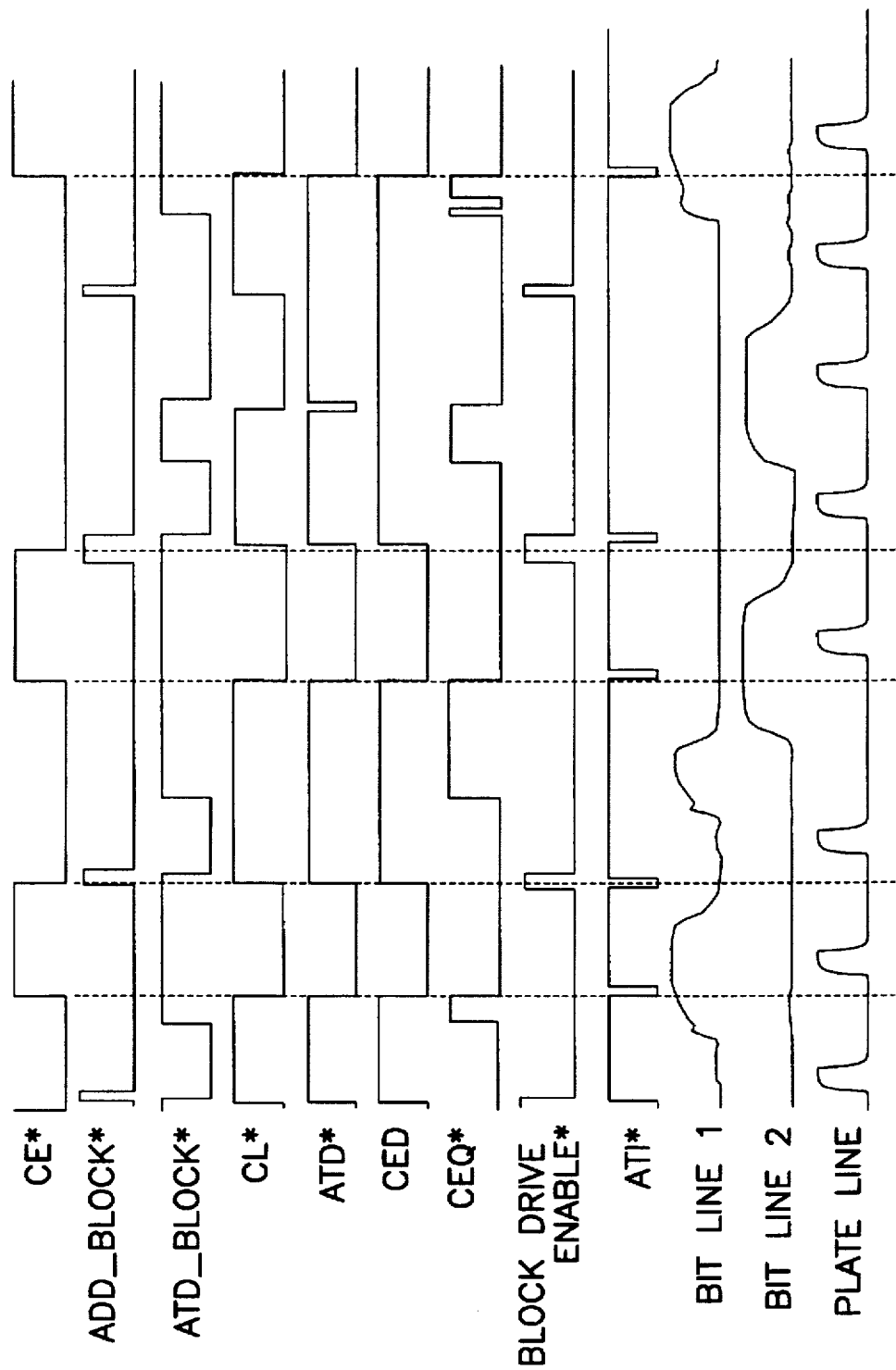
FIG. 12 is a timing diagram of read/write operation of a memory cell of FIG. 6.

To more fully understand the operation of the circuits described in FIGS. 711, reference is made to the timing diagram of FIG. 12. The operations of reading data from and writing data to a row of memory cells in a memory array are commonly referred to as "page mode" operations. To perform a page mode operation, the chip enable, CE*, input must be low. The Buffer Enable* signal goes low to enable the buffer circuit described above in reference to FIG. 7. The state of the address line is latched, so that the logic level of each address input An is latched by flip-flop 160. The ATn* line will pulse low as explained with reference to FIG. 8 if the address input An is low when Buffer Enable* goes low. Line AT1* is shown as pulsing low to illustrate a low signal on address input 1. CED is the delayed inverse of the CE* signal and pulls the ATD* signal high by enabling NAND gate 174. Both CED and ATD* in combination with flip-flops 190 and 194 pull the clock signal, CL*, high as described above.

When the ATD* signal goes high it activates NAND gate 182 so that the ATD_Block* signal goes low. Likewise, a high voltage level on the CL* signal in combination with flip-flop 184 pulls the Add_Block* signal low. The BlockDrive_Enable* signal goes low after the Add_

Block* signal goes low to prepare pulse generator 188. That is, if the BlockDrive_Enable* signal goes high after the CL* signal returns low, Add_Block* will toggle to a high state.

With both ATD_Block* and Add_Block* low, the memory cell at the addressed row and column can be accessed without the risk of losing data. In a ferroelectric memory, the plate line is fired so that a voltage is produced on one of the bit lines. The voltage is dependent upon both the plate line voltage and the polarization of the memory cell. The reference voltage is coupled to one of the bit lines and the sense amplifiers are strobed after a sufficient time has passed to allow a differential voltage to be developed between the bit lines. The p-sense amplifier is typically strobed first and then the N-sense amplifier is strobed. The bit lines are then driven to power rails in response to the differential voltage created by firing the plate line. The I/O lines are equilibrated prior to coupling the bit lines thereto such that a read operation can be performed faster. The CEQ* signal is then used to reset the ATD_Block* signal to a high state. That is, flip-flop 176 is toggled when CEQ* goes high such that the output of NAND gate 182 goes high.

As detailed above, the data stored in the ferroelectric memory cell can be lost when the plate line is fired. If the memory cell is storing a logical zero the memory cell will maintain a zero, however, the memory cell will be "written" to a zero if the memory cell is storing a logical one when the plate line is fired. To re-write a one to the memory cell, the bit line connected to the memory cell must go high when the plate line is low. The address transition circuit described above should, therefore, only be enabled after the n-sense amplifier has been fired. The ATD* signal can be used to notify the controller 108 that a new address has been received on the address lines. The controller 108, therefore, can complete any page mode operations being performed when it is notified of the address change by the ATD* signal. The address, however, will still be blocked from the address buffer circuit until the Add_Block* signal returns high upon the completion of the re-write operation.

If the logic state of the data stored in the cell is to be changed upon reading the present logic state (read/write operation), the new state must be permanently stored in the memory cell prior to changing the row address. As stated above, a one can be written to the memory cell by raising the connected bit line high while the plate line is low. To write a zero, however, the plate line must be raised while the bit line is at a low voltage. Therefore, during a write operation the row address cannot change until either the bit line is raised or the plate line is raised. For example, in FIG. 12 the data initially stored on the memory cell is a zero as shown by bit line 1 remaining low when the sense amplifiers are strobed. The bit lines are then reversed using the I/O lines to write a one to the memory cell. The plate line is strobed high a second time to insure that data is stored on the memory cell, as explained above.

When the page mode operations are complete, the CE* line can be raised to begin to reset the circuits. When ATD goes low, the CL* signal also goes low as a result of flip-flop 194. The circuit shown in FIG. 10 is enabled, such that when either the CED or BlockDrive_Enable* transition to a high state the Add_Block* signal will return high. It will be recognized that the re-write procedure can be performed after the CE* line goes high. The Add_Block* signal will not go high until either a new CE* cycle begins or a new address is received, as indicated by Block_drive enable*.

Conclusion

A circuit and method have been described for prohibiting the change of an address until data has been stored in a ferroelectric memory cell. The detection of an address transition is inhibited until a memory cell is accessed, read, and the data which was read is restored to the memory. The transitions of address line inputs can then be monitored and used to close a current operation so that a new operation can be performed at the new address. Changing to a new row address is prohibited until the current operation at the current address is completed. Upon completion, the new address is latched into a row address buffer.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, different logic circuits can be used in place of those illustrated in FIGS. 7–11 to generate the signals which regulate the monitoring of address line inputs and latching the current row address. Therefore, it is manifestly intended that this invention be limited only by the claims and the equivalents thereof.

What is claimed is:

1. An integrated memory circuit comprising:
   a memory array having a plurality Of ferroelectric memory cells arranged in rows and columns;
   address inputs to receive an address of a first row of the memory array;
   access circuitry to access a row of the memory array; and
   address protection circuit comprising:
      an address blocking circuit to latch the address of the first row of the memory array and prevent a second row of the memory array from being accessed;
      detection circuit to detect a transition of the address inputs; and
      an address detection blocking circuit to disable the detection circuit.

2. The integrated memory circuit of claim 1 wherein the detection circuit comprises:
   a plurality of comparator circuits connected to each one of the address inputs for comparing a present state of the address inputs to a prior state of the address inputs; and
   a generator circuit connected to the plurality of comparator circuits to produce a signal used to enable the address detection blocking circuit.

3. The integrated memory circuit of claim 1 wherein the address detection blocking circuit comprises:
   a flip-flop coupled between the address inputs and the detection circuit; and
   a latch circuit electrically located between the flip-flop and the address inputs to latch the flip-flop.

4. An integrated memory circuit comprising:
   a memory array having a plurality of ferroelectric memory cells arranged in rows and columns;
   address inputs to receive an address of a first row of the memory array;
   access circuitry to access a row of the memory array; and
   address protection circuit comprising:
      an address blocking circuit to latch the address of the first row of the memory array and prevent a second row of the memory array from being accessed, the address blocking circuit comprises:
         a flip-flop coupled to the address inputs; and
         a latch circuit electrically located between the flip-flop and the address inputs to latch the flip-flop.

5. An integrated static memory circuit comprising:

a memory array having a plurality of ferroelectric memory cells arranged in rows and columns;

a controller;

a plurality of address inputs for receiving row addresses;

access circuitry coupled to the plurality of address inputs for accessing a row in response to a received row address; and address protection circuitry connected to the controller comprising:

detection circuit coupled to the plurality of address inputs for detecting a transition in the received row addresses;

address detection blocking circuit connected to the detection circuit for selectively disabling the detection circuit; and an address blocking circuit connected to the controller to selectively latch the address of a first row of the memory array and prevent a second row of the memory array from being accessed.

6. A method of protecting data stored in a ferroelectric memory having a plurality of ferroelectric memory cells arranged in rows and columns, a plurality of address input lines for receiving row addresses, and detection circuit coupled to the address input lines for detecting a transition in the received row addresses, the method comprising the steps of:

receiving a first address of a first row on the address input lines;

disabling the detection circuit; and reading data stored on ferroelectric memory cells located on the first row.

7. The method of claim 6 further including the steps of:

enabling an address blocking circuit to latch the first address of the first row;

restoring the data read from the ferroelectric memory cells located on the first row; and disabling the address blocking circuit.

8. The method of claim 6 further including the steps of:

enabling the detection circuit;

detecting a receipt of a second address of a second row on the address input lines using the detection circuit; and restoring the data read from the ferroelectric memory cells located on the first row in response to the detection circuit.

* * * * *